United States Patent [19]

Lockwood

[11] 3,996,482
[45] Dec. 7, 1976

[54] ONE SHOT MULTIVIBRATOR CIRCUIT
[75] Inventor: George C. Lockwood, Dayton, Ohio
[73] Assignee: NCR Corporation, Dayton, Ohio
[22] Filed: May 9, 1975
[21] Appl. No.: 575,912
[52] U.S. Cl. .............................. 307/273; 307/246; 307/279; 307/297
[51] Int. Cl.² ................ H03K 3/284; H03K 3/353; H03K 17/60; H03K 1/02
[58] Field of Search .......... 307/246, 273, 279, 297; 328/205, 207, 214, 251

[56] References Cited
UNITED STATES PATENTS

| | | | |
|---|---|---|---|
| 3,678,407 | 7/1972 | Ahrons | 330/35 |
| 3,691,537 | 9/1972 | Burgess | 307/279 X |
| 3,719,835 | 3/1973 | Eberhard | 307/273 |
| 3,770,987 | 11/1973 | McSweeney | 307/273 X |

FOREIGN PATENTS OR APPLICATIONS 939,599  10/1963  United Kingdom ............... 307/273

Primary Examiner—John S. Heyman
Assistant Examiner—Larry N. Anagnos
Attorney, Agent, or Firm—J. T. Cavender; Lawrence P. Benjamin

[57] ABSTRACT

An improved one shot multivibrator circuit is described which is particularly adapted for use with field-effect transistor (FET) manufacturing techniques such as metal oxide semiconductor (MOS) large scale integration (LSI) manufacturing techniques. Such a one shot multivibrator circuit is particularly adapted for FET application because the period of its output pulse is independent of the threshold voltages of the transistors used in the circuit design. The one shot multivibrator circuit comprises a capacitor for fixing the period of the output pulse; a bias network including a current mirror as a constant current source for charging the capacitor; a first inverter stage comprising a switching transistor and a load transistor for controlling the charging and discharging of the capacitor; and a second inverter stage as the output stage for providing the output pulse having its turn-on controlled by the first inverter stage and its turn-off controlled by the voltage level on the capacitor.

9 Claims, 3 Drawing Figures

ONE SHOT MULTIVIBRATOR CIRCUIT

BACKGROUND OF THE INVENTION

This invention relates to one shot multivibrator circuits, and more particularly, it relates to a one shot multivibrator circuit particularly adapted for manufacture by FET techniques such as MOS LSI techniques.

The threshold voltage of FET devices is dependent upon processing parameters which are difficult to control. For example, the surface charge density, surface contamination, doping levels, etc., all are difficult to control in the manufacture of MOS LSI devices. Yet each of these parameters of the finished device affects the threshold voltage of the finished device. The prior art one shot multivibrator circuits are turned "on" and "off" when a control signal first exceeds and then drops below a threshold voltage of the MOS device used in the circuit. Accordingly, if the threshold voltage of the various FET transistors can vary by as much as 33 percent due to the processing parameters which are difficult to control, the output pulse width can also vary within wide limits.

SUMMARY OF THE INVENTION

It is an object of the present invention to provide a one shot multivibrator circuit specifically adapted for use with FET technologies such as MOS LSI technologies.

Another object of the present invention is to provide a one shot multivibrator circuit having an output pulse width which is substantially independent of the threshold voltage levels of the transistors used in the circuit.

A still further object of the present invention is to provide a one shot multivibrator circuit which is substantially independent of power supply voltage variations within a MOS LSI circuit.

Another object of the present invention is to provide a one shot multivibrator circuit for use in MOS LSI wherein the output pulse width is a function of the value of the MOS capacitor used in the circuit.

A still further object of the present invention is to provide a one shot multivibrator circuit having an output pulse width dependent upon the oxide thickness of the MOS capacitor used in the circuit.

A still further object of the present invention is to provide a one shot multivibrator circuit having an output pulse width substantially independent of the power supply voltage for the circuit.

These and other objects, features, characteristics, and advantages will be apparent by consideration of the following description of the preferred embodiment of the invention, as illustrated by the accompanying drawings.

BRIEF DESCRIPTION OF THE INVENTION

The present invention employs a biasing means for generating a constant current flow which is substantially independent of process variations; an input inverter stage comprising a load transistor and a switching transistor, and an input junction formed at the source-drain connection of the input inverter stage. One end of the timing capacitor is connected to this first junction and the other end of the timing capacitor forms an output junction with a current mirror and an output inverter stage. The output inverter stage comprises a load transistor, a switching transistor, and an output terminal, which is formed at the source-drain connection of the output inverter stage.

An input timing pulse is applied to the input junction which initiates the following functions: First, the timing capacitor is charged; second, the switching transistor in the output inverter is turned on causing the output waveform to go positive as the beginning of the output pulse. With the capacitor charged and the input timing pulse removed from the input junction, the capacitor discharges through the switching transistor in the first inverter causing the voltage at the second junction to gradually become more positive until it is above the negative threshold of the switching transistor in the output inverter. When the voltage on the capacitor becomes more positive than the negative threshold voltage of the switching transistor in the output inverter, the switching transistor turns off and the output junction rises towards the more positive voltage level of the power supply which is zero volts in the preferred embodiment. The output pulse is terminated when the switching transistor in the output inverter turns off.

DETAILED DESCRIPTION OF THE INVENTION

Figure 1:
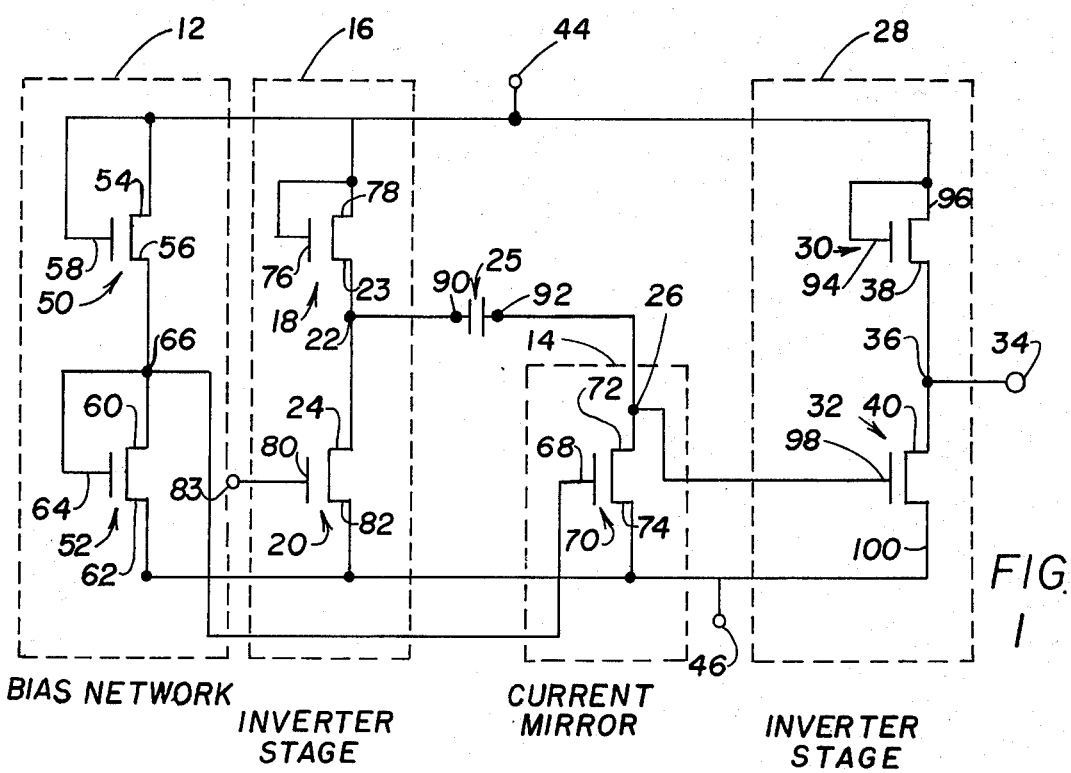
FIG. 1, is a schematic diagram of the one shot multivibrator circuit.

Referring to FIG. 1 there can be seen a schematic view of a one shot multivibrator circuit including a bias network 12, and a current mirror 14. An inverter stage 16 comprises a load transistor indicated generally at 18 and a switching transistor located at 20. A first input junction 22 is formed by the connection of a source electrode 23 of the transistor 18 and a drain electrode 24 of the transistor 20. A timing capacitor 25 is connected between the junction 22 and a second junction 26. The junction 26 is connected to a current mirror 14 and an output inverter shown generally at 28. The output inverter also comprises a load transistor 30 and a switching transistor 32. An output terminal 34 is connected to a third output junction 36 formed at the connection of the source electrode 38 of the transistor 30 and the drain electrode 40 of the transistor 32.

The power supply (not shown) for operating the circuit shown in FIG. 1 comprises a first potential level available at a terminal 44 which is more negative than the second potential level which is available at a terminal 46. In the preferred embodiment, the more negative potential level at terminal 44 is at −24 volts while the more positive potential level at terminal 46 is at ground potential.

The bias network 12, shown in FIG. 1, comprises a first transistor 50 and a second transistor 52. The first transistor 50 has drain, source and gate electrodes shown at 54, 56 and 58, respectively. The drain electrode 54 is connected to the potential level terminal 44, and the gate electrode 58 is connected to the drain electrode 54. The transistor 52 comprises drain, source and gate electrodes shown at 60, 62 and 64, respectively. The gate electrode 64 is connected to the drain electrode 60 of the transistor 52 as well as to the source electrode 56 of the transistor 50 at a bias junction 66. The source electrode 62 of the transistor 52 is connected to the more positive voltage level available at the terminal 46.

The bias junction 66 provides a voltage level as an input to a gate electrode 68 of a current mirror transistor 70. The current mirror transistor 70 has a drain electrode 72 and a source electrode 74. The source electrode 74 of the current mirror transistor 70 is connected to the more positive voltage level at the terminal 46. The drain electrode 72 is connected to the junction 26.

The load transistor 18 of the inverter stage 16 additionally has a gate electrode 76 connected to a drain electrode 78 of the same transistor. Both of these last mentioned electrodes are connected to the more negative voltage level at terminal 44 of the power supply. The switching transistor 20 of the inverter stage has a gate electrode shown at 80 and a source electrode shown at 82. The source electrode 82 is connected to the more positive voltage supply level at terminal 46. The gate electrode 80 receives the input timing pulses shown in line A of FIG. 3 through an input terminal 83.

The capacitor 25, shown in FIG. 1, has a first terminal 90 connected to the junction 22 and a second terminal 92 connected to the junction 26.

The load transistor 30 of the output inverter 28 has a gate electrode 94 connected to a drain electrode 96 of the same transistor and both of these last mentioned electrodes are connected to the more negative voltage level at terminal 44. The switching transistor 32 of the output inverter 28 has a gate electrode at 98 which is connected to the drain electrode 72. A source electrode 100 of switching transistor 32 is connected to the more positive voltage level at terminal 46 of the power supply.

Figure 3:
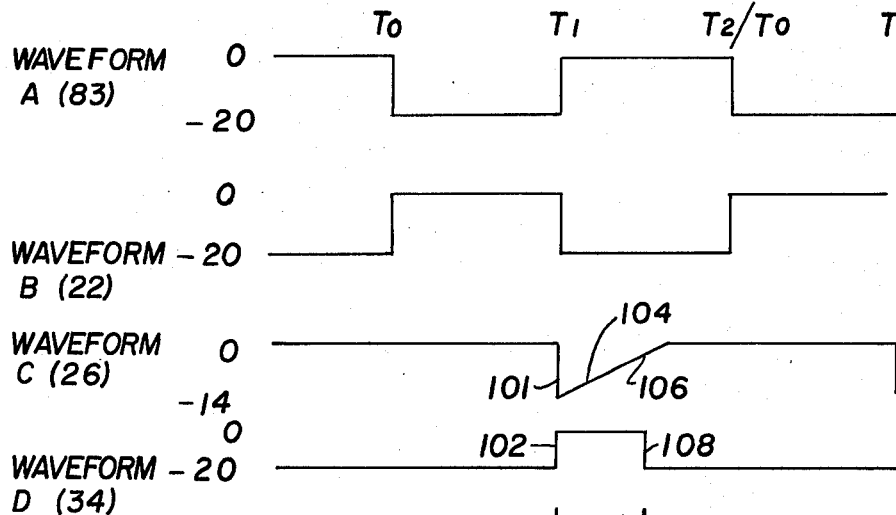
FIG. 3, shows a plurality of waveforms applied to and generated by the circuit shown in FIG. 1.

Referring to FIG. 3, there can be seen a plurality of waveforms A through D associated with the circuit shown in FIG. 1. Waveform A shows the input timing pulse applied to terminal 83, while waveform B shows the inverse of waveform A at the output of the inverter stage 16. Both signals have an "on" time and an "off" time, which will be referenced to the effect each signal has with reference to the switching transistor 20 in the input inverter 16.

During the time period beginning at $T_0$ and ending at $T_1$, an input signal turns the transistor 20 "on" and the voltage at the junction 22 rises towards a Vss level of 0 volts at terminal 46. During the time period beginning at $T_1$ and ending at $T_2/T_0$, the input signal turns the transistor 20 "off" and the junction 22 falls towards a Vdd level of −20 volts at terminal 44 and reaches −20 volts.

The waveform at C shows the voltage on the capacitor taken at the junction 26. The waveform at D shows the output pulse available at terminal 34.

OPERATION OF THE INVENTION

The bias network 12 provides a biasing voltage to the current mirror 14 and the current mirror transistor 70 generates a current which is independent of junction 26 voltage and device transconductance. This independence is due to the fact that all three transistors 50, 52 and 70 are built on the same chip and the variations in any one device compensate for the same variations found in the other devices. The amount of current flowing in either the bias network or in the current mirror is fixed at a constant value. The current flow is selected by the geometries of the individual devices. In the preferred embodiment, the transistor 70, comprising the current mirror, has its gate 68 made 100 times narrower than the gate 64 in its corresponding transistor 52 in the bias network. Therefore, the current through the current mirror transistor 70 is 100 times smaller than the current through the corresponding transistor 52. In this manner a constant current flow is generated by the transistor 70 based on geometries and/or sizes of the devices used.

The inverter stage 16 performs the traditional inverter function wherein the signal at junction 22 is the inverse of the signal applied to the input terminal 83 of the switching transistor 20.

The capacitor 25 is connected between the current mirror 14 and the junction 22. The function of the capacitor 25 is to determine the time period of the output pulse based on the time that it takes to charge the capacitor 25 to a predetermined voltage level by the current mirror 14.

The output inverter stage 28 is both a buffering stage and an output driving stage for generating at its output junction 36 an output pulse having an "on" time which lasts as long as the signal appearing at the junction 26 turns "on" the transistor 32.

The switching transistor 32 is first turned "on" when the input timing signal applied to the terminal 83 turns the transistor 20 "off" which causes the voltage at junction 22 to drop to −20 volts as shown in waveform B. The voltage at the gate electrode 98 of the output switching transistor 32 rises to a value determined by the voltage division between the voltage drop over the capacitor 25 and the voltage drop over the gate capacitance of the gate electrode 98 itself. The voltage change at the junction 26 is shown in waveform C by the numeral 101. In the preferred embodiment, this voltage change is about −14 volts, which is sufficient to turn on the switching transistor 32 and raise the voltage level at the junction 36 from a −20 volts to 0 volts as indicated by the line 102 in waveform D.

The capacitor 25 now charges, as indicated by the slope of the line 104 as shown in line C of FIG. 3. Once the voltage at junction 26 reaches point 106, the turn "off" threshold voltage for the output switching transistor 32 is reached and transistor 32 turns off, as indicated by the line 108 shown in line D of FIG. 3.

Referring to FIGS. 1 and 3, the steady state condition of the circuit will be explained. The bias network 12 is conducting and provides a predetermined voltage level at the junction 66 for application to the gate electrode 68 of the current mirror 14. The current mirror is not conducting, since the voltage at junction 26 equals zero.

The input signal at terminal 83 is shown as waveform A in FIG. 3. This voltage level of the input signal is at the −20 volts level. The −20 volt signal is sufficient to turn on transistor 20, thereby causing current flow to pass between the negative level at terminal 44 of the power supply through transistors 18 and 20 and the ground level at terminal 46 of the power supply.

The output inverter stage 28 is turned off because the gate electrode 98 of the output transistor 32 is connected to the junction 26 which is effectively at the 0 volt level, which is insufficient to turn on the switching transistor 32. In review, transistor 20 is conducting hard because of the signal applied to its gate electrode 80 and the transistor 32 is turn off because an enabling signal is not available for its gate electrode 98.

At $T_1$ the timing signal, shown in waveform A, rises from the −20 volt level to the 0 level, thus turning off transistor 20. The voltage at junction 22 drops towards the negative voltage level of the power supply and this voltage is immediately divided by the capacitance value of the capacitor 25 and the gate capacitance of the gate electrode 98 of the output transistor 32. The junction 26 drops to −14 volts which is sufficient to turn on the switching transistor 32 whereby the voltage level at junction 36 and output terminal 34 rises towards the voltage level indicated by the more positive voltage supply level.

In this manner capacitor 25 is connected between the more positive voltage level at terminal 46 by the current mirror 14 and the more negative voltage level at terminal 44 by the load transistor 18. Current flows in this path which now includes the capacitor 25 and the capacitor is charged at a constant rate toward the positive voltage level by the constant current flow from the constant current mirror 14. This is indicated by the line 104 in the waveform C. When the charge on the capacitor reaches the level indicated at the point 106 on the waveform C, the transistor 32 turns off, and the output waveform drops to −20 as indicated by the line 108.

The period of the output pulse indicated by the line 110 is given by the following equation in the preferred embodiment:

$I_1 = I_2 = 100$ microamps.
$I_3 = 1$ microamp $$\text{period of output pulse} = \frac{CV}{I_3}$$

$$= \frac{1.2_p F(14-6)V}{I_3}$$

$$= 9.6 \text{ microsecond}$$

where:
$I_1$ = the current through the transistor 50;
$I_2$ = the current through the transistor 52;
$I_3$ = the current through the transistor 70;
C = the value of capacitance of the capacitor 25 in picofarads
V = difference in voltage at the junction 26, which is −14 caused by the voltage division of the capacitor 25 and the capacitance of the gate junction of the transistor 32 and the threshold voltage of the transistor which is −6 volts in this embodiment.

The main variables being the size of the capacitor and the selected value of the charging current. The use of the current mirror gives a constant charging current. The value of the capacitor is determined by the thickness of the gate oxide used in the manufacture of the capacitor and the area of the capacitor.

Obviously, the period of the output pulse can be varied by varying the different parameters in the circuit shown. The values of current, capacitance, including the capacitance of the transistor 32, can be varied. Also the threshold voltage of transistor 32 can also be varied.

While the value of the capacitor may be varied, it is desirable in microelectronic circuits to keep the value of the order of only a few picofarads as was described in the discussion of the preferred embodiment. In order to utilize the capacitor construction which has such a low capacitance and still be able to produce output pulses of the order of 10 microseconds, it is necessary that the charging current of the capacitor be kept at a very low value such as approximately 1 μA described herein. Heretofore it had not been possible to utilize capacitance of such low value in one shot multivibrators constructed by FET techniques.

As aforestated, the low constant current provided by the mirror circuit transistor 70 combined with the biasing circuit 12 which together form a low constant current source, while this low constant current source is an essential ingredient of the disclosed microelectronic multivibrator providing output pulses on the order of 10 microseconds. The low constant current generator described herein may be utilized to advantage wherever low constant currents are required in microelectronic circuits. Note, for example, the utilization of this circuit in my co-pending application for "Field-Effect Transistor Memory System", Ser. No. 577,142, filed May 13, 1975.

Figure 2:
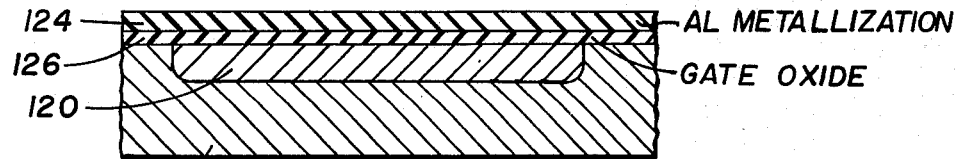
FIG. 2, is a cross-sectional view of the timing capacitor used in the circuit shown in FIG. 1.

Referring to FIG. 2 there can be seen a cross-sectional schematic view of a MOS capacitor. The capacitor comprises a P+ diffusion 120 formed in a substrate 122 and a metallization layer 124 separated from the P+ diffusion by an oxide layer 126. The thickness of the oxide layer 126 can be precisely controlled. This precise control results in an MOS one shot multivibrator having variations in the period of its output pulse of less than 5 percent. This compares to prior art MOS one shot multivibrator circuits having variations in the period of their output pulses which reach 33 percent.

While the negative supply and signal voltages shown are proper for P-channel devices, a similar circuit using N-channel devices and positive voltages could be constructed.

While the invention has been particularly shown and described with reference to a preferred embodiment thereof, it will be understood by those skilled in the art that various changes in form and details may be made therein without departing from the spirit and scope of the invention.

I claim:
1. A one shot multivibrator circuit of the type operating with a voltage source having first and second voltage levels and the first voltage level is more negative than the second voltage level, and an input voltage waveform having a first and second voltage level and the first voltage level is more negative than the second voltage waveform for generating an output pulse having a predetermined pulse width, said one shot multivibrator circuit comprising,
 capacitance means for providing enabling and disabling voltage control signals,
 FET current generating means connected between said capacitance means and said second voltage level for providng a constant current to charge said capacitance means,
 FET input inverter means for switchably connecting said capacitance means with said current generating means under the control of the second voltage level of the input signal, to charge said capacitance means, and for disconnecting said capacitance means from said current generating means to discharge said capacitance means through said input inverter means, and
 FET output inverter means responsive to said voltage control signals provided by said capacitance means for generating the output pulse beginning with said enabling signal and ending with said disabling signal.

2. A circuit as recited in claim 1 wherein said current generating means further comprises,
 a first FET transistor having source, drain and gate electrodes, a second FET transistor having source, drain and gate electrodes, a third FET transistor having source, drain and gate electrodes, said gate and drain electrodes of said first transistor being connected to said first voltage level of said power supply, said gate and drain electrodes of said second transistor forming a bias junction with said source electrode of said first transistor, said source electrode of said second transistor being connected to said source electrode of said third transistor and both of said last mentioned source electrodes being connected to said second voltage level of said power supply, said gate electrode of said third transistor being connected to said bias junction, and said drain electrode of said third transistor being connected to said capacitance means for supplying a uniform charging current to said capacitance for generating a disabling signal to said output inverter when said capacitor has been charged to a predetermined voltage level.

3. A circuit as recited in claim 2 wherein said input inverter further comprises, a first FET transistor having source, drain and gate electrodes, a second FET transistor having source, drain and gate electrodes, said gate electrode and said drain electrode of said first FET transistor being connected to said first voltage level of said power supply, said drain electrode of said second transistor being connected to said source electrode of said first transistor for forming an input junction, said source electrode of said second transistor being connected to said second voltage level of said power supply, and said gate electrode of said second transistor being connected to an input terminal for receiving the input voltage waveform.

4. A circuit as recited in claim 3 wherein said output inverter further comprises, a first FET transistor having source, drain and gate electrodes, a second FET transistor having source, drain and gate electrodes, said gate electrode and said drain electrode of said first FET transistor being connected to said first voltage level of the power supply, said drain electrode of said second transistor being connected to said source electrode of said first transistor for forming an output junction, said source electrode of said second transistor being connected to said second voltage level of said power supply, and said gate electrode of said second transistor being connected to said capacitance means for receiving said enabling and disabling voltage control signals.

5. A circuit as recited in claim 4 wherein, said capacitance means is an MOS capacitor having an oxide layer of predetermined thickness and area for determining the period of the output pulse, and said capacitor is connected between said input junction and said drain electrode of said third transistor of said current generating means.

6. A circuit as recited in claim 1 wherein, said input inverter comprises a load transistor and a switching transistor, and said switching transistor is responsive to the more positive voltage level of the input waveform to turn off for beginning the charging of said capacitance means by said current generating means, and said switching transistor is responsive to the more negative voltage level of the input waveform to turn on for discharging said capacitance means.

7. A circuit as recited in claim 6 wherein, said output inverter comprises a load transistor and a switching transistor, and said switching transistor is responsive to the more positive voltage level of the input waveform to turn on for beginning the period of the output pulse, and said switching transistor is responsive to the generation of a disabling signal by said capacitance means for ending the period of the output pulse.

8. A circuit as recited in claim 7, wherein said capacitance means comprises, a MOS capacitor having an oxide layer of predetermined thickness and area for determining the period of the output pulse, and said capacitor is connected between said switching transistor in said input inverter and said current generating means.

9. A MOS circuit as recited in claim 8, wherein said current generating means includes a current mirror for providing a uniform current for charging said capacitor.

* * * * *